United States Patent
Wang

(10) Patent No.: US 6,342,432 B1
(45) Date of Patent: Jan. 29, 2002

(54) SHALLOW TRENCH ISOLATION FORMATION WITHOUT PLANARIZATION MASK

(75) Inventor: Weizhong Wang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/371,919

(22) Filed: Aug. 11, 1999

(51) Int. Cl.[7] .............................................. H01L 21/76
(52) U.S. Cl. ...................................................... 438/435
(58) Field of Search ................................ 438/424, 435, 438/437, 427

(56) References Cited

U.S. PATENT DOCUMENTS

| | | | | |
|---|---|---|---|---|
| 4,876,217 A | * | 10/1989 | Zdebel | 438/437 |
| 5,923,993 A | * | 7/1999 | Sahota | 438/427 |
| 6,001,708 A | * | 12/1999 | Liu et al. | 438/435 |
| 6,048,775 A | * | 4/2000 | Yao et al. | 438/427 |
| 6,087,262 A | * | 7/2000 | Yang et al. | 438/692 |

OTHER PUBLICATIONS

Wolf et al. "Silicon Processing for the VLSI Era" Lattice Press, 1986, vol. 1, p. 194.*

* cited by examiner

*Primary Examiner*—Olik Chaudhuri
*Assistant Examiner*—Anh Duy Mai
(74) *Attorney, Agent, or Firm*—McDermott Will & Emery

(57) ABSTRACT

A semiconductor device having shallow trench isolation (STI) is formed without dishing of the insulating material filling the trench, and without forming a planarization mask. Embodiments include forming a pad oxide layer and a polish stop layer, such as silicon nitride, on a semiconductor substrate, forming a trench in the substrate, and filling the trench with a first insulating layer, such as silicon dioxide. A second polish stop layer is then deposited on the first insulating layer, followed by a second, sacrificial insulating layer, such as silicon dioxide, to cover the second polish stop layer. The second insulating layer is then polished, as by CMP, to expose the second polish stop layer above the first polish stop layer, and the exposed portion of the second polish stop layer is then removed, as by wet etching, to expose the first insulating layer. The first and second insulating layers are then polished, as by CMP, to expose the first polish stop layer and the remaining portion of the second polish stop layer above the trench. The trench fill is planar at the trench edges and slightly higher than the main surface of the substrate, and exhibits no dishing. Thus, dishing of the trench fill is avoided without forming an expensive and complex planarization mask.

12 Claims, 6 Drawing Sheets

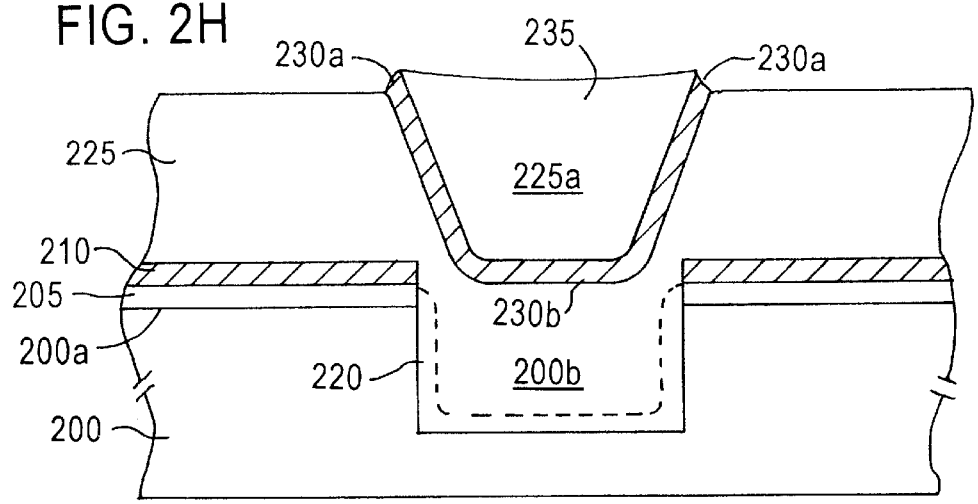
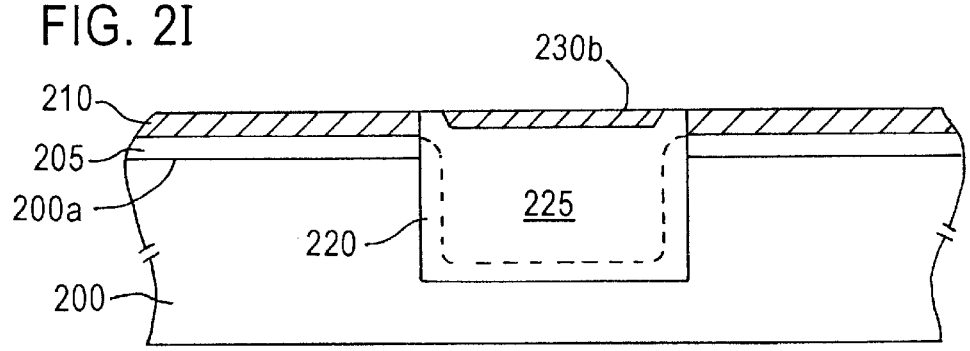
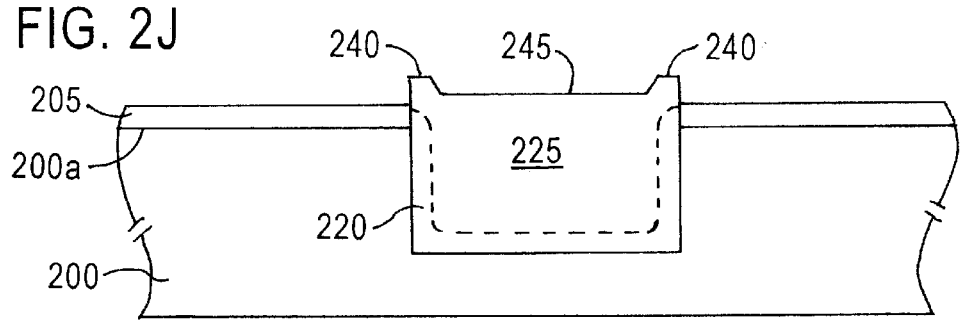

SHALLOW TRENCH ISOLATION FORMATION WITHOUT PLANARIZATION MASK

FIELD OF THE INVENTION

The present invention relates to a method of manufacturing a semiconductor device comprising trench isolation. The invention has particular applicability in manufacturing high-density semiconductor devices with submicron design features and active regions isolated by shallow insulated trenches.

BACKGROUND ART

Current demands for high density and performance associated with ultra large-scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically doped monocrystalline silicon, bounding the active regions.

One type of isolation structure is known as trench isolation, wherein shallow trenches are etched in the substrate and an oxide liner is thermally grown on the trench walls. The trench is then filled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate, and depositing a nitride polish stop layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then filled with an insulating material (or "trench fill"), such as silicon dioxide derived from tetraethyl orthosilicate (TEOS). The surface is then planarized to provide a flat surface at the trench edges, as by chemical-mechanical polishing (CMP) to the nitride polish stop, and the nitride and pad oxide are stripped off the active areas to complete the trench isolation structure.

Disadvantageously, during planarization, an excess amount of the trench fill tends to be removed, resulting in the top of the trench fill being "dished" in the middle; i.e., lower than the top of the trench. This condition complicates subsequent processing, thereby lowering manufacturing yield and increasing production costs.

To prevent dishing, conventional STI formation methodologies include the formation of an additional photolithographic mask, known as a planarization mask. As shown in FIG. 1A, a trench 100a is formed in a semiconductor substrate 100 after deposition of a pad oxide layer 105 and a nitride polish stop layer 110. An oxide liner 115 is then thermally grown, and trench 100a is filled with an insulating material 120. Insulating material 120 is then polished, as by CMP, to obtain a flat upper surface, as shown in FIG. 1B. The portion of insulating material 120 above trench 100a is masked by photoresist mask 125 (see FIG. 1C), then the portions of insulating material 120 unprotected by mask 125 are etched, as shown in FIG. 1D. Mask 125 is then removed, and insulating material 120 is further polished, as by CMP, down to the level of polish stop layer 110 (see FIG. 1E). After polish stop 110 is removed, the trench fill 120 is above the top of trench 100a, as shown in FIG. 1F.

Although this conventional methodology avoids dishing of the trench fill, it requires the formation of a complex photolithographic planarization mask, which significantly increases production costs and reduces manufacturing throughput.

There exists a need for a method of manufacturing a semiconductor device with STI wherein the trench fill is not dished and the STI formation process does not require the formation of an expensive planarization mask.

SUMMARY OF THE INVENTION

An advantage of the present invention is a method of manufacturing a semiconductor device having STI without dishing of the insulating material filling the trench and without forming a planarization mask.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a first polish stop layer on a main surface of a semiconductor substrate or an epitaxial layer formed on the semiconductor substrate; forming a trench in the substrate or epitaxial layer; depositing a first insulating layer to fill the trench and cover the first polish stop layer such that a trough is formed in the first insulating layer above the trench; forming a second polish stop layer on the first insulating layer; depositing a second insulating layer to fill the trough and cover the second polish stop layer; polishing the second insulating layer to expose a portion of the second polish stop layer above the first polish stop layer; etching to remove the exposed portion of the second polish stop layer; and polishing to expose the first polish stop layer and a portion of the second polish stop layer above the trench.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 2A–2J schematically illustrate sequential phases of a method in accordance with an embodiment of the present invention.

DESCRIPTION OF THE INVENTION

Conventional methodologies for manufacturing semiconductor devices with STI employ a costly photolithographic mask during planarization to protect the area above the trench and prevent dishing of the trench fill. The present invention avoids the increased manufacturing cost of forming a planarization mask by eliminating the mask entirely.

According to the methodology of an embodiment of the present invention, a first polish stop layer, such as silicon nitride, is deposited on a substrate, then a trench is formed in the substrate. As used throughout the present disclosure and claims, the term "substrate" denotes a semiconductor substrate, an epitaxial layer formed on the semiconductor substrate, a well region in a semiconductor substrate or a semiconductor layer formed on a non-conductive substrate. A first layer of insulating material is thereafter deposited, such as silicon dioxide by LPCVD, to fill the trench and cover the first polish stop layer, thereby creating a trough in the first insulating layer above the trench.

A second polish stop layer, such as silicon nitride, is then deposited on the first insulating layer, followed by a second, sacrificial insulating layer, such as silicon dioxide. The second insulating layer is deposited such that it fills the trough and covers the second polish stop layer. The second insulating layer is then polished, as by CMP, to expose the second polish stop layer above the first polish stop layer, and the exposed portion of the second polish stop layer is then removed, as by wet etching, to expose the first insulating layer. The first and second insulating layers are then polished, as by CMP, to expose the first polish stop layer and the remaining portion of the second polish stop layer above the trench.

After removal of the first polish stop layer and the remainder of the second polish stop layer, as by etching, the trench fill is planar at the trench edges and slightly higher than the main surface of the substrate, and exhibits no dishing. The trench fill being higher than the main surface does not cause difficulty, since the upper portion will be etched away, in large part, in subsequent processing. By providing a second polish stop layer and a sacrificial insulating layer to prevent dishing of the trench fill, the methodology of the present invention avoids the necessity of forming a planarization mask, thereby reducing production costs.

Figure 1A:
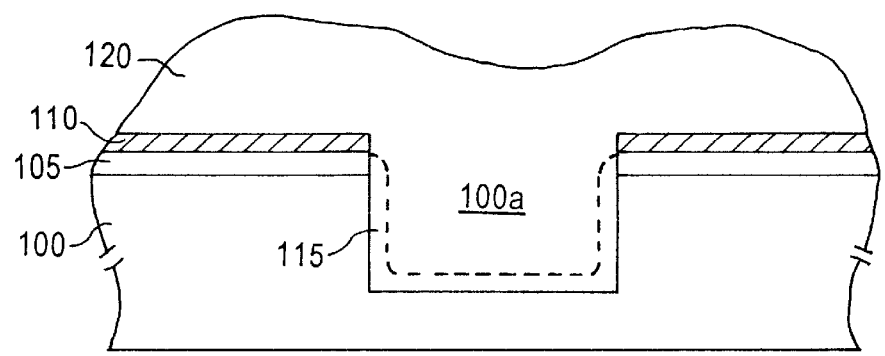
FIGS. 1A–1F schematically illustrate sequential phases of a conventional method of STI formation.
Figure 1B:
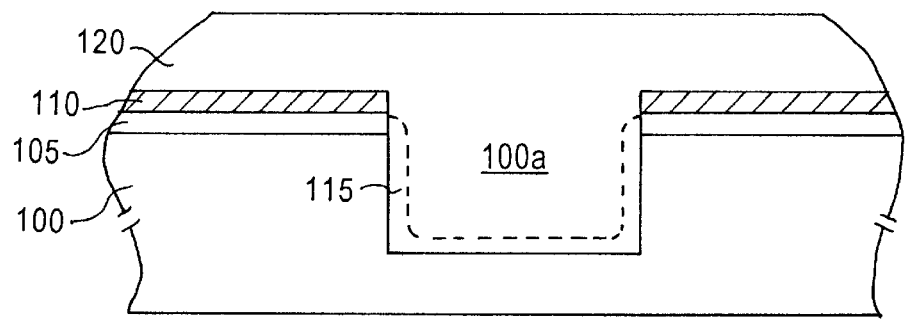
Figure 1C:
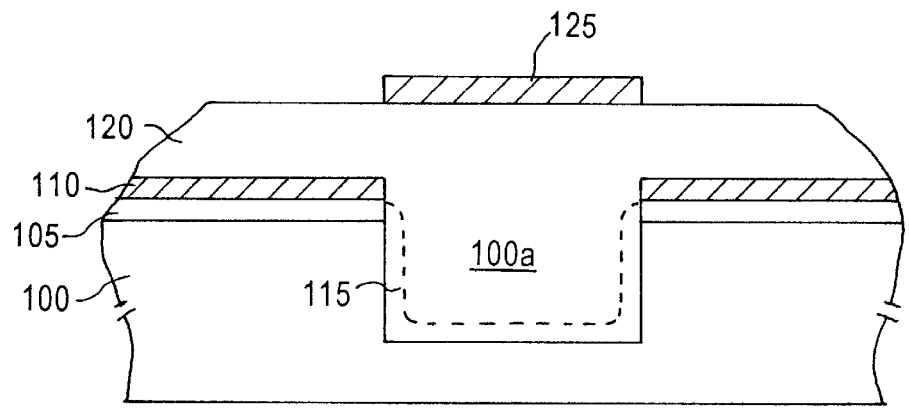
Figure 1D:
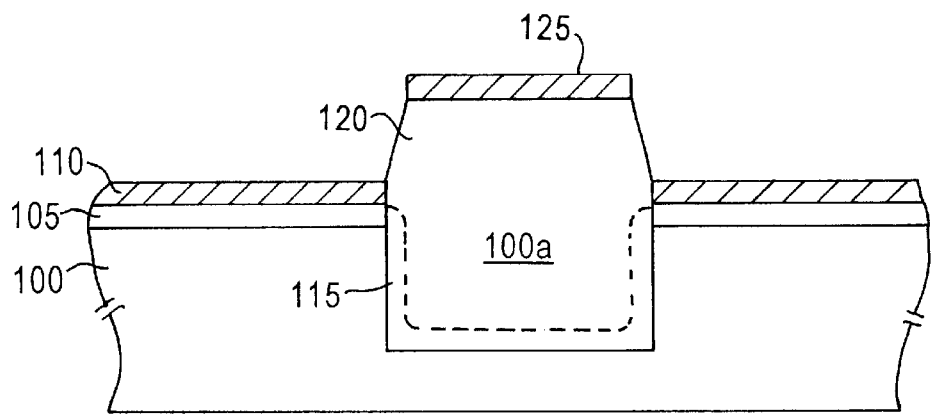
Figure 1E:
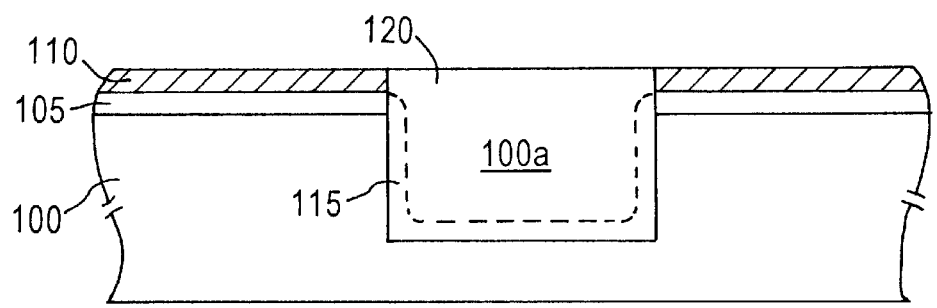
Figure 1F:
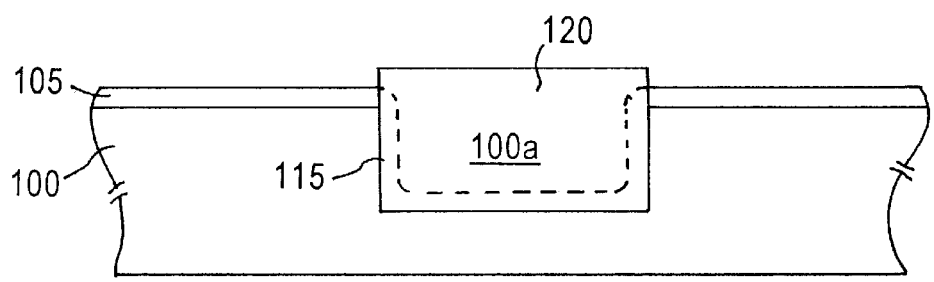
Figure 2A:
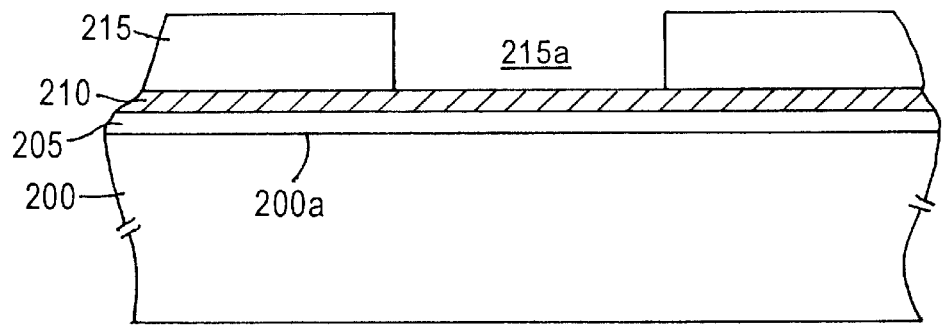

An embodiment of the present invention is illustrated in FIGS. 2A–2J, wherein sequential phases in forming a semiconductor device in accordance with the present invention are depicted. Referring to FIG. 2A, substrate 200 is prepared having a substantially planar main surface 200a, typically a semiconductor substrate comprising doped monocrystalline silicon or an epitaxial layer formed on a semiconductor substrate in accordance with conventional practices. A pad oxide layer 205 is then grown on the substrate 200. Pad oxide layer 205 is typically silicon oxide and can be thermally grown on the substrate or deposited by chemical vapor deposition (CVD) to a thickness of about 100 Å to about 200 Å.

After formation of the pad oxide layer 205, a first polish stop layer 210 is deposited on the pad oxide layer 205, as shown in FIG. 2A, such as a silicon nitride layer by CVD, to a thickness of less than about 1000 Å. Silicon oxide pad layer 205 functions as a buffer layer cushioning stresses between substrate 200 and first polish stop layer 210. In addition to acting as a polish stop during the subsequent planarization process, first polish stop layer 210 also functions as an oxidation mask, as it is resistant to the diffusion of oxygen and water vapor therethrough, thereby preventing an oxidizing species from reaching the underlying silicon substrate.

Figure 2B:
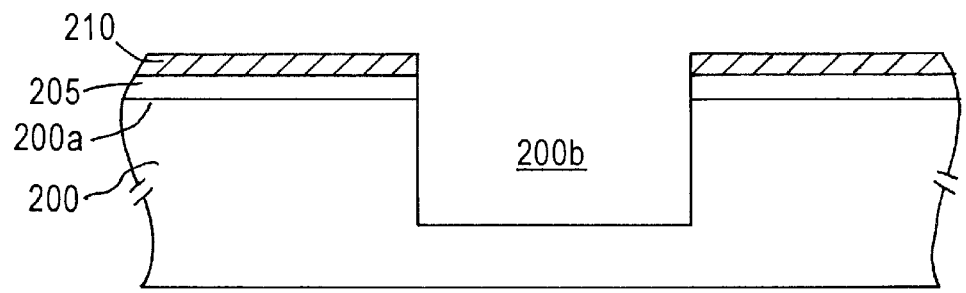
Figure 2C:
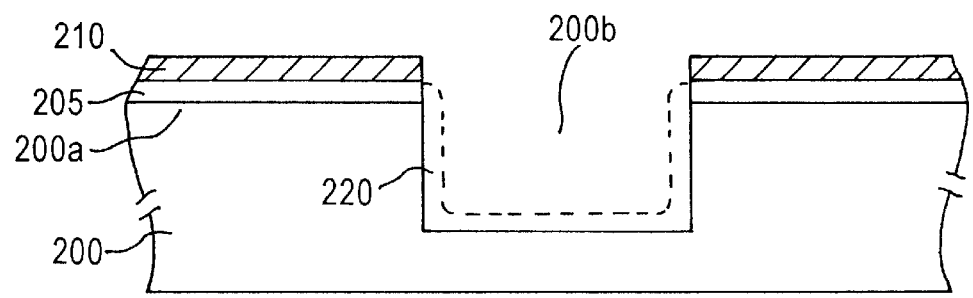

A photoresist mask 215 is then formed on first polish stop layer 210. Photoresist mask 215 has a pattern defined by openings 215a, which have a width substantially corresponding to the width of the subsequently formed trench. First polish stop layer 210 is then etched away, and the etching continues through pad oxide layer 205 and into substrate 200 to form a shallow trench 200b whose inner surfaces are substantially vertically aligned with first polish stop layer 210 and pad oxide layer 205, as shown in FIG. 2B. Trench 200b is typically etched to a depth of about 2500 Å to about 5000 Å. When the etching of trench 200b is completed, photoresist mask 215 is stripped off first polish stop layer 210. Thereafter, the inner surface of trench 200b is thermally oxidized to form an oxide liner 220, typically at a temperature of about 800° C. or higher. FIG. 2C shows trench 200b with completed liner 220.

Figure 2D:
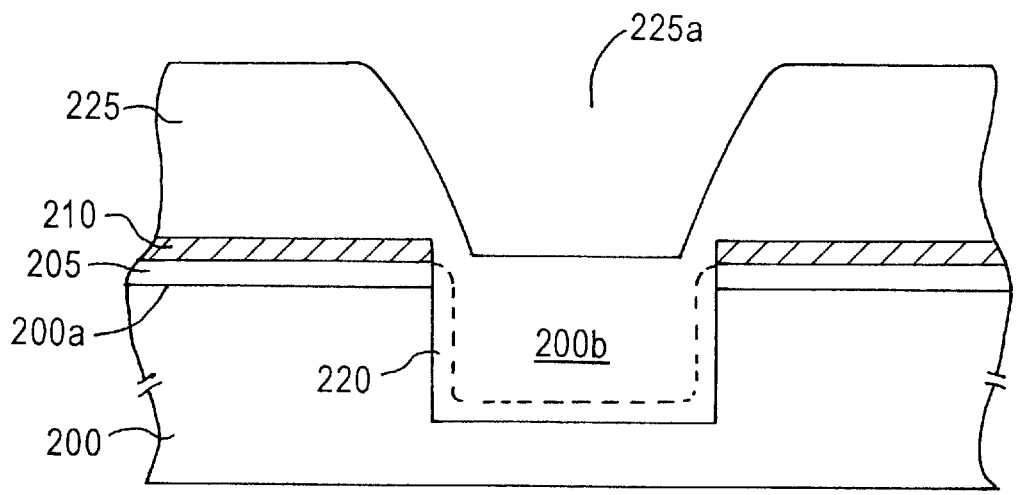

Subsequent to formation of oxide liner 220, a first insulating layer 225 is deposited to fill trench 200b and cover first polish stop layer 210, as shown in FIG. 2D. First insulating layer 225 can comprise silicon dioxide derived from TEOS by LPCVD or derived from silane by LPCVD. Alternatively, first insulating layer 225 can comprise a high density plasma (HDP) oxide, preferably employing the methodology disclosed in copending application Ser. No. 08/924,133, filed Sep. 5, 1997, the entire disclosure of which is hereby incorporated herein by reference. First insulating layer 225 is preferably conformally deposited such that it extends above main surface 200a about 100 Å to about 500 Å over trench 200b (i.e., such that it fills trench 200b and extends above the top of trench 200b), and such that it has a thickness above first polish stop layer 210 about equal to the depth of trench 200b. As a result, first insulating layer 225 has a "trough" 225a above trench 200b.

Figure 2E:
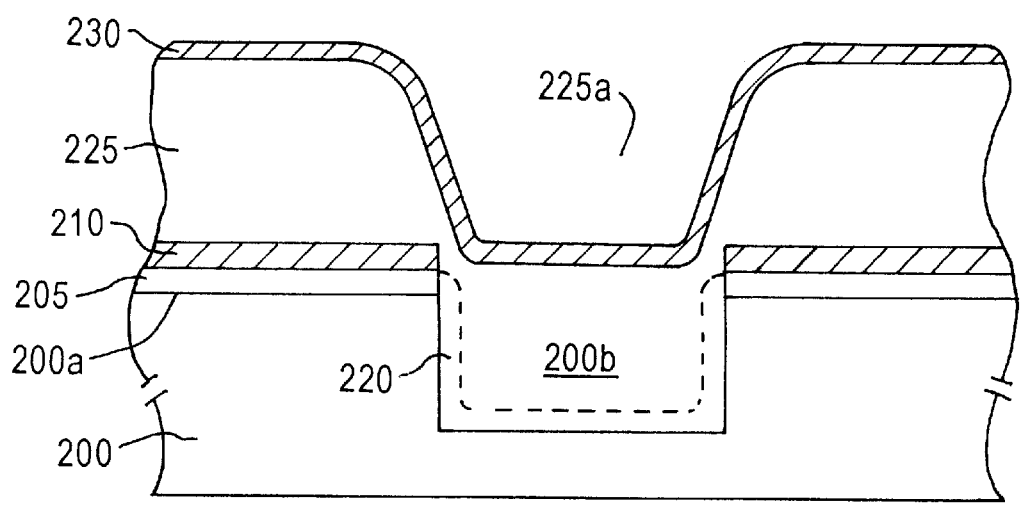
Figure 2F:
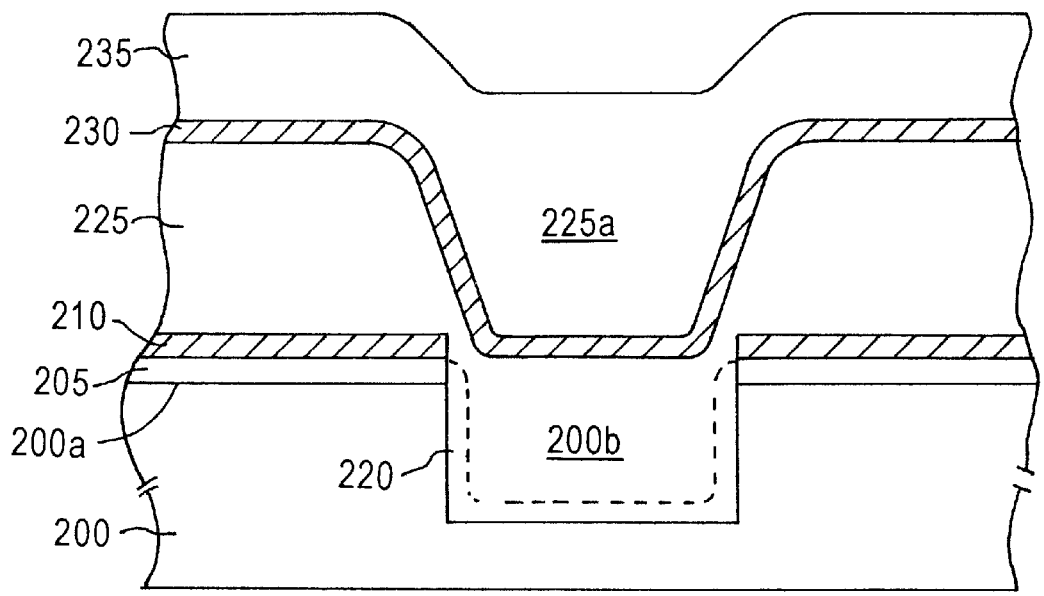

Next, as shown in FIG. 2E, a second polish stop layer 230 is formed on the upper surface of first insulating layer 225, such as a silicon nitride layer by CVD, to a thickness about equal to that of first polish stop layer 210; i.e., about 1000 Å or less. A second insulating layer 235 is then deposited, such as silicon dioxide derived from TEOS by LPCVD, derived from silane by LPCVD, or comprising a HDP oxide (see FIG. 2F). Since second insulating layer 235 is a sacrificial layer; that is, it will be completely removed during processing and not become part of the finished device, it can be formed in any convenient manner. Second insulating layer 235 is deposited to fill trough 225a and cover second polish stop layer 230; in other words, such that the lowest portion of second insulating layer 235 is above second polish stop layer 230.

Figure 2G:
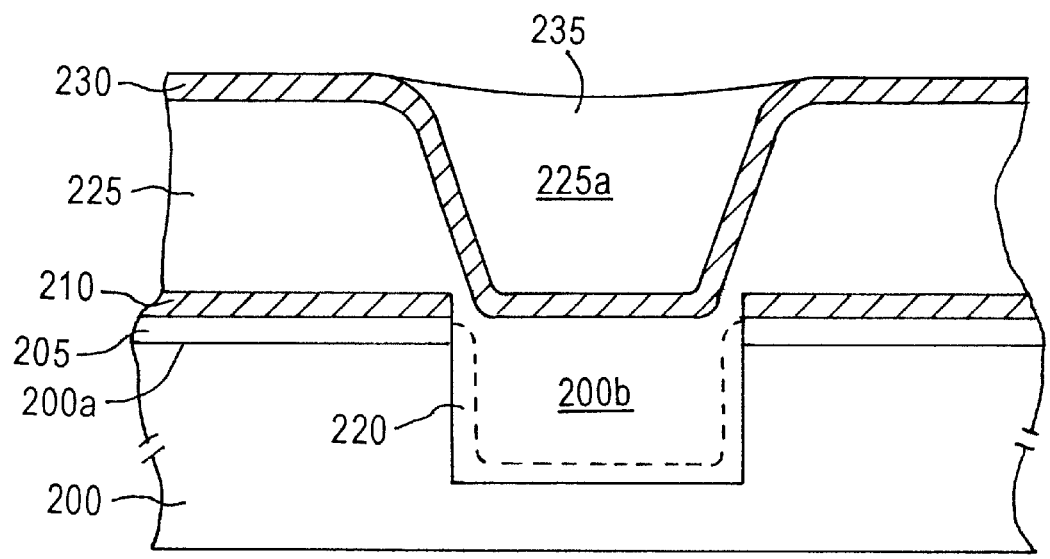

Referring now to FIG. 2G, second insulating layer 235 is polished, as by CMP, to expose a portion of second polish stop layer 230 above first polish stop layer 210. The exposed portion of second polish stop layer 230 is then removed, as by wet etching, as shown in FIG. 2H. First insulating layer 225, second insulating layer 235 and portions 230a of second polish stop layer 230 are then polished, as by CMP, to expose first polish stop layer 210 and the portion 230b of second polish stop layer 230 above trench 200b (see FIG. 2I). Portions 230a of second polish stop layer 230 are easily polished away since they are substantially vertical, and thus present a small cross-sectional area to the polisher.

First polish stop layer 210 and the remaining portion 230b of second polish stop layer 230 are thereafter removed, as by etching, as shown in FIG. 2J. The completed STI structure has trench fill 225 with planar portions 240 at the trench edges and an upper surface 245 that is not dished. Trench fill 225 is higher than main surface 200a; however, a portion of its excess height will be removed as subsequent processing steps are performed.

By providing second polish stop layer 230 on trench fill oxide layer 225, and sacrificial oxide layer 235 on second polish stop layer 230, the present methodology enables the formation of an STI structure with flat trench edges 240 while avoiding dishing of trench fill 225, and does not require a, complex and expensive planarization mask. Thus, the present invention decreases manufacturing cost and increases production throughput.

The present invention is applicable to the manufacture of various types of semiconductor devices having STI, particularly high density semiconductor devices having a design rule of about 0.25µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming a first polish stop layer on a main surface of a semiconductor substrate formed on the semiconductor substrate;

forming a trench in the substrate;

depositing a first insulating layer to fill the trench and cover the first polish stop layer such that a trough is formed in the first insulating layer above the trench;

forming a second polish stop layer on the first insulating layer;

depositing a second insulating layer to fill the trough and cover the second polish stop layer;

polishing the second insulating layer to expose a portion of the second polish stop layer above the first polish stop layer and leave the exposed portion of the second polish stop layer intact;

etching to remove the exposed portion of the second polish stop layer; and polishing to expose the first polish stop layer and a portion of the second polish stop layer above the trench.

2. The method according to claim 1, comprising forming a pad oxide layer on the main surface prior to forming the first polish stop layer.

3. The method according to claim 2, comprising thermally growing an oxide liner in the trench prior to depositing the first insulating layer.

4. The method according to claim 1, comprising depositing the first insulating layer such that the bottom of the trough extends about 100 Å to about 500 Å above the main surface.

5. The method according to claim 1, wherein the trench has a depth below the main surface, comprising depositing the first insulating layer such that a portion of the first insulating layer above the first polish stop layer has a thickness about equal to the trench depth.

6. The method according to claim 5, wherein the trench depth is about 2500 Å to about 5000 Å.

7. The method according to claim 1, wherein the first and second polish stop layers have a thickness of about 1000 Å or less.

8. The method according to claim 1, comprising removing the first polish stop layer and the portion of the second polish stop layer above the trench.

9. The method according to claim 1, comprising polishing by chemical-mechanical polishing.

10. The method according to claim 1, comprising wet etching to remove the exposed portion of the second polish stop layer.

11. The method according to claim 1, wherein the first and second insulating layers comprise silicon dioxide derived from tetraethyl orthosilicate (TEOS) by low pressure chemical vapor deposition (LPCVD), silicon dioxide derived from silane by LPCVD, or a high-density plasma oxide.

12. The method according to claim 1, wherein the first and second polish stop layers comprise silicon nitride.

* * * * *